(12) United States Patent
Simpson et al.

(10) Patent No.: US 6,197,697 B1
(45) Date of Patent: Mar. 6, 2001

(54) METHOD OF PATTERNING SEMICONDUCTOR MATERIALS AND OTHER BRITTLE MATERIALS

(75) Inventors: Todd William Simpson; Ian Vaughan Mitchell, both of London; Grantley Oliver Este, Dunrobin; Frank Reginald Shepherd, Kanata, all of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/377,053

(22) Filed: Aug. 19, 1999

(30) Foreign Application Priority Data

Aug. 28, 1998 (CA) .................................................. 2246084

(51) Int. Cl.$^7$ ..................................................... H01L 21/00
(52) U.S. Cl. .............................. 438/705; 216/62; 216/87; 438/690; 438/715
(58) Field of Search ..................................... 438/690, 705, 438/708, 715; 216/62, 73, 87

(56) References Cited

U.S. PATENT DOCUMENTS

| | | | |
|---|---|---|---|
| 4,333,226 | * | 6/1982 | Abe et al. ........................ 438/705 X |
| 4,880,493 | * | 11/1989 | Ashby et al. ........................ 438/705 |
| 5,178,725 | * | 1/1993 | Takeno et al. ........................ 216/87 |
| 5,449,630 | * | 9/1995 | Lur et al. ........................ 438/705 X |
| 5,994,230 | * | 11/1999 | Huntoon ............................... 438/705 |

OTHER PUBLICATIONS

Considine, D. and G., ed, Van Nostrand's Scientific Encyclopedia, 7$^{th}$ Edition, New York, 1989, pp. 1849–1854.
Kaminsky, M., "Plasma Contamination and Wall Erosion in Thermonuclear Reactors", IEEE Transactions on Nuclear Science, vol. NS–18, No. 4, Aug. 1971, pp. 208–217.
Kaminsky, M., et al, "Radiation Blistering of Polycrystalline Niobium by Helium–Ion Implantation", J. Appl. Phys., vol. 44, No. 1, Jan. 1973, pp. 25–31.
Bruel, M., "Application of Hydrogen Ion Beams to Silicon On Insular Material Technology", (Elsevier Science BV) Nuclear Instruments and Methods in Physics Research B 108 (1996), pp. 313–319.

\* cited by examiner

*Primary Examiner*—William Powell
(74) *Attorney, Agent, or Firm*—Victoria Donnelly

(57) ABSTRACT

A method of patterning a brittle material, and particularly a semiconductor material, is provided comprising ion implantation induced selective area exfoliation. The method includes steps of masking the material, implanting unmasked regions of the material, with light ions of Hydrogen or Helium, and rapid thermal annealing at the temperature causing exfoliation of the material from the implanted regions. As a result, the material is patterned to a depth determined by the depth of ion implantation. The method allows patterning through crystalline or non-crystalline materials, or several layers of different materials at the same time. When the mask has straight sharp edges aligned parallel to natural cleavage planes of the semiconductor material, the exfoliation results in formation of high quality sidewall-facets of exfoliated material and of the remaining patterned material at the boundaries of exfoliated regions.

28 Claims, 7 Drawing Sheets

METHOD OF PATTERNING SEMICONDUCTOR MATERIALS AND OTHER BRITTLE MATERIALS

RELATED APPLICATION

This application is related to U.S. patent application Ser. No. 09/377,054 entitled "METHOD OF CLEAVING A SEMICONDUCTOR WAVER" to the same inventors, filed concurrently herewith and incorporated herein by reference.

FIELD OF THE INVENTION

This invention relates to a method of patterning brittle materials, and in particular to a method of patterning semiconductor materials.

BACKGROUND OF THE INVENTION

Patterning of the materials used in the semiconductor industry is one of the major steps in fabrication of microelectronic devices, integrated circuits and optoelectronic devices including semiconductor lasers. Conventionally known methods of patterning comprise selectively masking a semiconductor material with a photoresist or any other masking material, followed by etching. Known etching methods include selective wet chemical etching, or dry etching, e.g. plasma and reactive ion etching. (E.g., see Van Nostrand's Scientific Encyclopedia, 7th Edition, Ed. by Douglas and Glenn Considine, NY, 1989, pp. 1851–1852.) Anisotropic etching processes are known for defining microscopic structures of sub-micron dimensions.

Nevertheless, there are limitations associated with known etching processes, for example, in etching multilayer structures of different materials, because etchants are material specific and often only one layer of a particular material can be etched with a specific etchant. Thus etching through several layers of different materials may require numerous steps and be time consuming and costly. Control of etch rates, sidewall and perimeter profiles may present challenges requiring careful control of etch parameters, which is also necessary to reduce unwanted etch damage, and etch residues and edge distortions and provide reproducible and consistent etch processes. Etching of deep structures may be time consuming, or require multiple steps. Endpoint control is required to prevent underetching and overetching, undercutting and other distortions. Etchants may include hazardous or reactive materials requiring special handling expense for safe handling, and high purity materials to prevent contamination of sensitive semiconductor structures. Furthermore, there are some materials which cannot be readily etched using conventional techniques, e.g. some dielectrics such as lithium fluoride, lithium niobate.

Therefore a need exists for development of alternative methods for patterning brittle materials, and particularly semiconductor materials, which would for example avoid multiple step etching for patterning through multi-layer structures, and allow rapid deep patterning, and be applicable to an extended list of materials.

SUMMARY OF THE INVENTION

Thus, the present invention seeks to provide a method of patterning brittle materials, including semiconductors, which avoids or reduces the above-mentioned problems.

Therefore, according to a first aspect of the present invention there is provided a method of patterning a brittle material, comprising the steps of: selectively masking the material; implanting unmasked regions of the material with ions to a pre-determined depth; annealing to cause exfoliation of the material from the implanted regions.

Thus a method of patterning brittle materials such as semiconductors, ceramics, etc., is provided for a wide range of applications.

The dose of ion implantation, the depth of ion penetration, and the rate and temperature of annealing are determined so as to cause exfoliation, and separation of the material from the implanted regions, thereby patterning the material, by ion induced selective area exfoliation.

Typical ions suitable for the implantation step are the light ions of hydrogen or helium or isotopes thereof, or an inert gas of neon or its isotopes, depending on the material to be patterned. Annealing of the material may be performed by, for example, rapid thermal annealing, furnace annealing, annealing by use of electron beams, ion beams, or laser beams. These methods provide thermal heating of the material up to a required temperature causing exfoliation and separation of the implanted regions as will be described in more detail below. This method of patterning is applicable to a crystalline or non-crystalline material, provided the material is sufficiently brittle to cleave during exfoliation. Exfoliation occurs when the implanted ions lead to the formation of pressurized voids within the material thus initiation cleavage, preferably along natural cleavage planes of the material. For multi-layered semiconductor structures, the method may allow for patterning through several layers of the structure at the same time when the ions are implanted below the multi-layered structure. The mask may be removed either before or after the annealing step. Typical depths of patterning semiconductor materials according to the above method may range from about a few nanometers to about tens of micrometers depending on the application, and the lateral dimensions of exfoliated pieces may range from a few micrometers to several centimeters. The method is thus potentially applicable to a wide range of materials and structures including for example applications in semiconductor processing for integrated circuits and optoelectronic devices.

More complex patterns may be defined with multiple masking steps and implantation steps. For example, masking and implantation may be repeated a number of times before performing annealing to cause exfoliation. Multiple implants with different ions, energies and doses in different areas of the sample may be made before the annealing and exfoliation. Masks may be removed before or after annealing, as required. Alternatively, multiple exfoliation steps may be performed sequentially. The mask may be removed before or after the annealing step.

Multiple implantations at different energies may be performed through the same mask for deep patterning of the material, the mask being removed either before or after the annealing step. The step of annealing may be a multi-stage process, wherein multiple annealing is performed, each subsequent annealing being performed at a higher temperature than the previous one, with the temperature of last stage annealing being performed at the temperature required for exfoliation.

For crystalline materials, when edges of masks are oriented along certain crystallographic directions of the material, exfoliation occurs along natural cleavage planes and results in the formation of high quality sidewall facets of the exfoliated material and of the complimentary patterned material remaining at the boundaries of exfoliated regions.

Typical materials for the mask include metals, e.g. gold, nickel or aluminum; dielectrics e.g. silicon dioxide or silicon nitride; organic materials e.g. conventional photoresists, or a combination thereof. Materials used for the mask must be thick enough to stop the implanted ions, robust enough to withstand the implantation without significant deformations, and allow definition of a required edge profile of the mask. Preferably, the mask is defined by use of photo-lithography, etching and lift-off techniques. Masks may be removed by suitable processes being well known in the semiconductor industry, for example, plasma ashing, chemical etching, mechanical polishing, or ion etching.

To facilitate exfoliation of the material along pre-determined boundaries, the method may further include a step of forming trenches at the boundaries and along the perimeter of the material to be exfoliated.

Preferably, these trenches are formed by etching, or, alternatively, by the method of patterning of the present invention. Conveniently, the depth of trenches is equal to or deeper than the depth of patterning of the material.

BRIEF DESCRIPTION OF THE DRAWINGS

The invention will now be described in greater detail with references to the attached drawings wherein.

DETAILED DESCRIPTION OF THE PREFERRED EMBODIMENTS

Figure 1A:
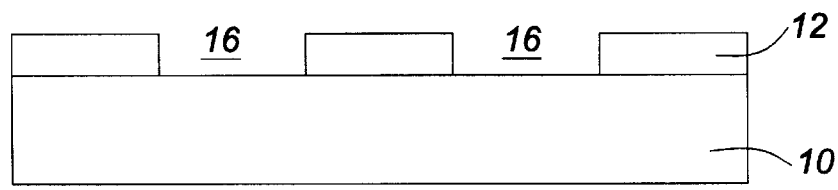
FIGS. 1a to 1e schematically illustrate consecutive steps of the method of patterning brittle/semiconductor material according to a first embodiment of the invention.
Figure 1B:
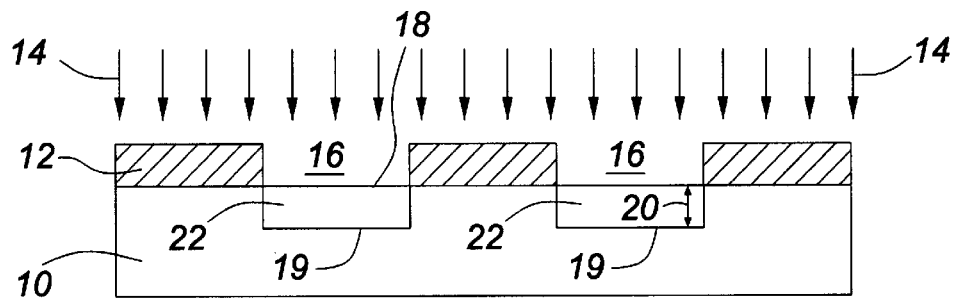
Figure 1C:
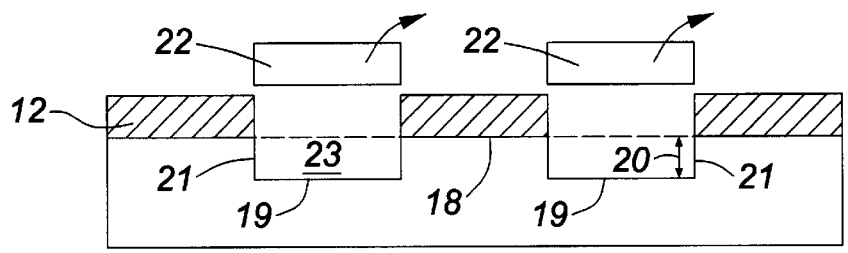
Figure 1D:
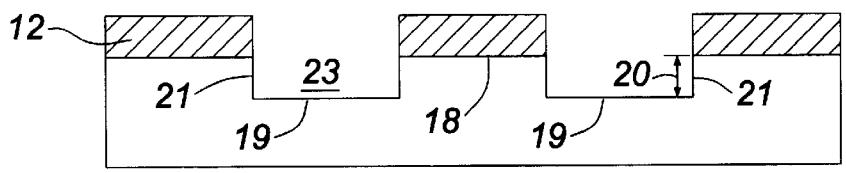
Figure 1E:
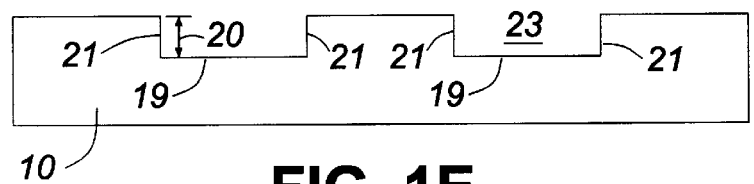

A method of patterning a brittle or semiconductor material according to the first embodiment of the invention was demonstrated using a GaAs semiconductor wafer. The method proceeds in steps which are schematically illustrated in FIG. 1. The wafer 10 is patterned by selectively masking the surface with a photoresist mask 12 (FIG. 1a). Then the masked wafer is implanted with a suitable dose of helium ions 14, which penetrate deeply into unmasked regions 16 of the wafer 10, and a majority of the ions come to rest at a projected range Rp, some distance below the surface 18 of the wafer 10, the distance being the depth 20 of ion penetration shown in FIGS. 1b to 1d. The implanted wafer is then rapidly thermally annealed at a rate and up to a temperature causing selective explosive exfoliation, as will be described in more detail below, causing separation of pieces 22 of GaAs from the implanted regions, leaving a complimentary structure with cavities 23 on the wafer (FIG. 1c). Thus the wafer 10 is patterned according to the details of the mask 12 to the depth 20 determined by ion implantation. FIG. 1d shows the wafer 10 after thermal annealing and exfoliation of the implanted regions with the mask 12 still on the wafer, the boundaries of the complimentary patterned material remaining on the wafer being designated by numeral 21. The mask is then removed as shown in FIG. 1e.

The method will now be described in greater detail below. The GaAs wafer 10 is a conventional wafer having a <100> oriented surface, having thickness of several hundred micrometers and lateral dimensions of several centimeters, which may be partially processed to define microelectronic or optoelectronic device structures. Optionally, the wafer is cleaned and pre-treated in a conventional manner before patterning, e.g., an oxygen plasma descum is used to remove hydrocarbons, followed by a chemical etch to remove surface oxides (e.g., 1:10 $NH_4OH:H_2O$ by volume, for GaAs). A vapor treatment of hexamethyldisilazane is applied to promote resist adhesion.

The wafer is then patterned by coating the wafer with photoresist, i.e. Shiple 1827 photoresist, having a thickness of 3.5 micrometers using an SVG™ track and according to program instructions. The photoresist is soft baked on the SVG track, and exposed with Cannon Wafer Stepper with an appropriate reticle for approximately 0.86 seconds to produce patterns in a range up to ~100 micrometers dimension, typical of those required for defining integrated circuit devices and optoelectronics device structures.

The wafer and reticle are oriented so as to achieve a pre-determined orientation of the mask pattern to the crystallographic directions of the wafer. The photoresist is then developed conventionally, i.e., using SVG track and MF319 developer, and hard baked at about 110 C. on the SVG™ track. An oxygen descum is performed in a Tegal 901e providing removal of about 300 angstroms of the photoresist, after which the wafer is exposed to a deep UV light source to cross link the mask pattern and to reduce pattern distortion. Thus, the surface of the wafer 10 is selectively masked with the resulting mask 12.

Implantation is performed by implanting a dose of $4\times10^{16}$ of helium ions 14, having energy of 3 MeV and penetrating into the wafer 10 to the depth 20 of about 4 micrometers. The depth to which exfoliation is required determines the implantation energy. The required energy is calculated using commercially available simulation software, for example "TRIM", or from experimental measurement. A typical energy is on the order of 1 MeV for a range of depths of 1–2 microns, depending on the type of substrate. In practice, the ion energy may range from tens of eV to many MeV, depending on the application. The dose to which the ions are implanted will depend to some extent on the energy; typically a deeper implant requires a higher dose to produce exfoliation. Typical implant doses are about $4\times10^{16}$ ions/$cm^2$ for a helium ion implantation and $1\times10^{17}$ ions/$cm^2$ for a hydrogen ion implantation. The temperature of the substrate during implantation is not critical if it is near room temperature, so that typical beam heating effects on the order of 50° C. (producing a substrate temperature of less than 100° C.) does not significantly affect the outcome of the process. For substrate temperatures significantly above room temperature, the implanted ions may diffuse out of the implanted region during the implantation step and therefore exfoliation may not occur. Optionally, the implanted wafer is stripped in the Gasonics for about 10 minutes at about 175° C., the step being repeated if necessary.

The annealing step is performed in a rapid thermal annealer (RTA) where, after loading the wafer and purging the chamber (e.g. with nitrogen gas), the temperature is ramped rapidly (typically 2–10 seconds) to about 350° C. Heating causes the implanted regions 22 to exfoliate from the wafer. Since exfoliation typically occurs during the temperature ramp-up, it is not necessary to hold the wafer at the final temperature for any length of time. Then any exfoliated pieces 22, which remain on the wafer, are blown off with filtered nitrogen and collected. The photoresist mask is removed from the wafer and exfoliated pieces by chemical solvents or by plasma ashing.

There is a minimum temperature required to achieve the exfoliation process. The minimum temperature was determined to be ~300° C. for GaAs or InP substrates, and 350° C. was preferred. In practice, the exfoliation process occurs more completely when the temperature is ramped as quickly as possible to the minimum temperature. The exfoliation will occur almost instantaneously across the entire wafer once a critical temperature is reached. Heating beyond that point appears to have no additional effect on the exfoliation. There is a practical limit to how high an annealing temperature may be. III–V semiconductor materials such as GaAs will begin to decompose noticeably at high temperatures, e.g., 800° C.; an overpressure P or As overpressure during annealing may be used to suppress surface decomposition. More significantly, in practice, diffusion of impurities occurs well below decomposition, and may be detrimental to structures or devices defined in the substrate. For example diffusion of dopants may render active devices inoperable. Therefore, the maximum temperature for the exfoliation process is only a practical maximum dictated by other devices or structures which are present on the wafer, and when there is a need to minimize surface decomposition. It may be possible to choose the order of fabrication for particular devices so that the devices subject to a restricted thermal budget are the exfoliation step.

The physics of ion implantation induced exfoliation has been studied for many years, being initially focused on exfoliation of thin films and blister formation in Nb under He ion bombardment, see, e.g., articles by M. Kaminsky, IEEE Trans. Nucl Sci., NS-18, 208 (1971) and by S. K. Das and M. Kaminsky, J. Appl. Phys., 44, 25 (1973). Recently the research has been intensified in regard to a technology known as "Smart-Cut" which relies on non-selective area implantation of light ions into silicon and subsequent annealing to induce fracture of a complete layer parallel to the wafer surface, see, e.g., "Application of hydrogen ion beams to Silicon on Insulator material technology" by Michael Bruel in Nuclear Instruments and Methods in Physics research B 108 (1996), pp. 313–319. It was found that the implanted ions lead to the formation of small platelets of a size of a few nanometers between planes of the crystal. As the dose increases, more of the platelets are formed, and eventually they grow together to form voids or bubbles of tens of nanometers in diameter. The implanted ions form a pressurized gas within the bubbles. As the dose increases, presence of the voids in the crystal causes stress which eventually builds-up to the point where plastic deformation occurs to relieve the stress, i.e., the formation of blisters and flaking of the caps of the blisters. At the point that this occurs, the blister is one large pressurized void. This will occur at random points across an implanted region and the blisters are typically quite large (1 millimeter). In our experiments, the dose is only high enough to form small pressurized voids where they have not yet grown together. We believe that the annealing step causes the pressure of the gas in these voids to increase to the point of plastic deformation. The fact that the voids are still quite small is important for producing sharply defined boundaries between implanted and unimplanted regions, i.e. high quality sidewall-facets.

Figure 2A:
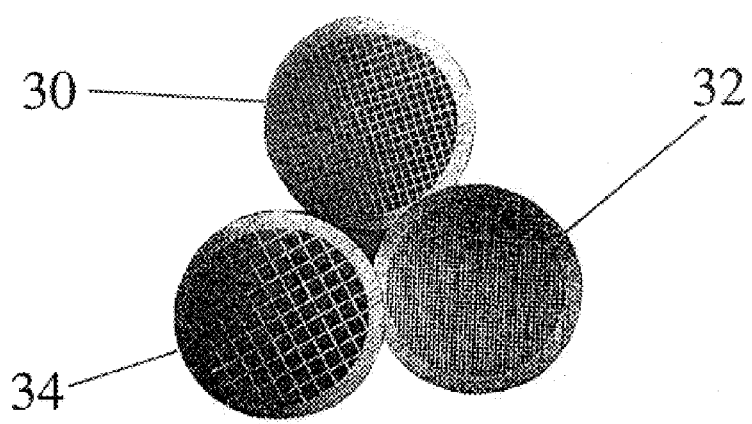
FIG. 2a is a photograph of nickel TEM grids used in the experiments.
Figure 2B:
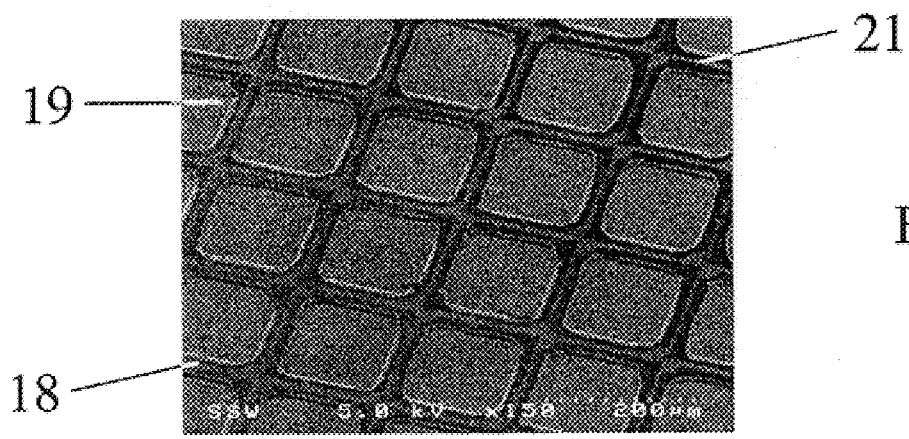
FIG. 2b is a top view SEM photograph of the patterned structure remaining on GaAs wafer after exfoliation of the material according to the method of FIG. 1.
Figure 3A:
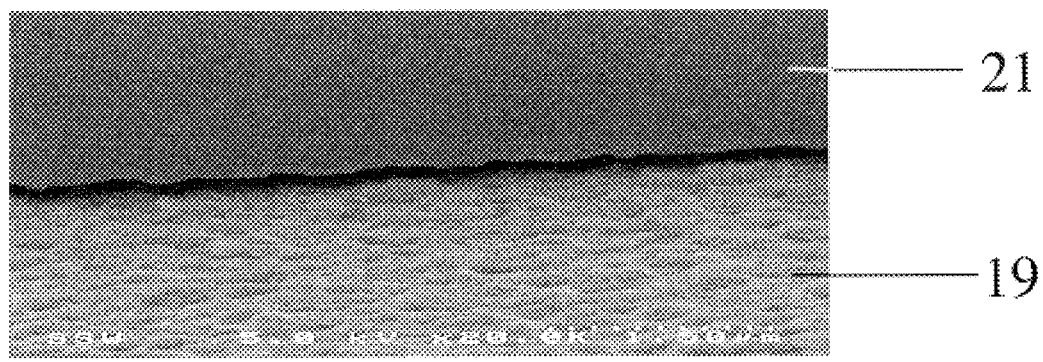
FIGS. 3a and 3b are SEM photographs of the sidewall-facets of InP and GaAs patterned wafers correspondingly.
Figure 3B:
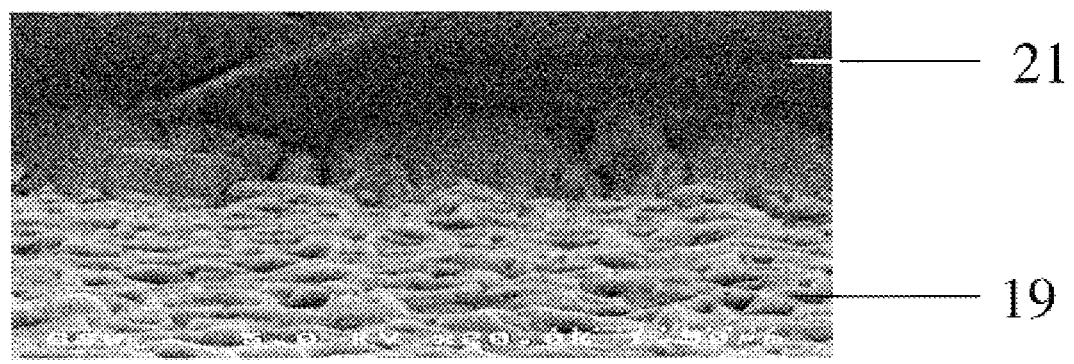
Figure 4A:
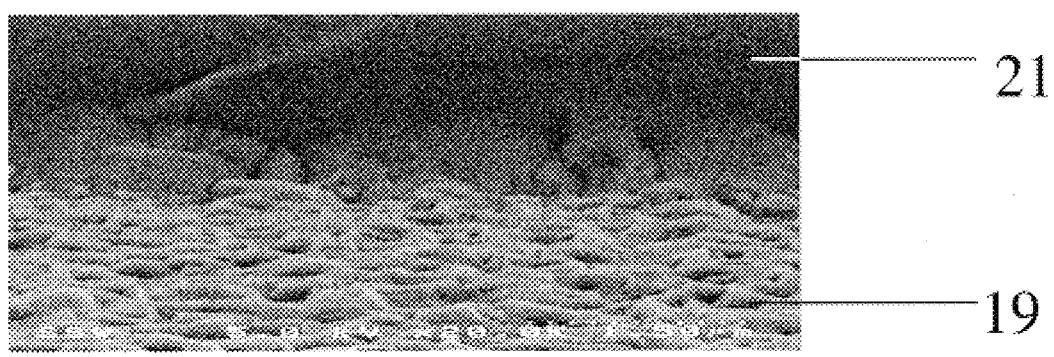
FIGS. 4a and 4b are SEM photographs of an InP wafer annealed at 350° C. and 450° C. correspondingly.
Figure 4B:
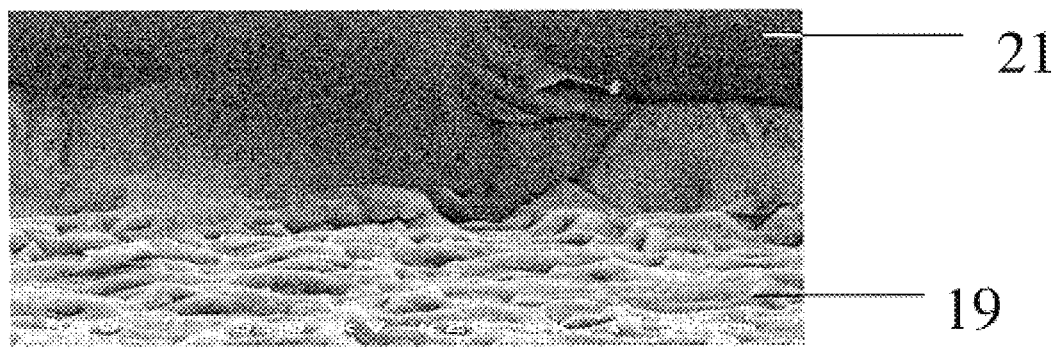
Figure 5A:
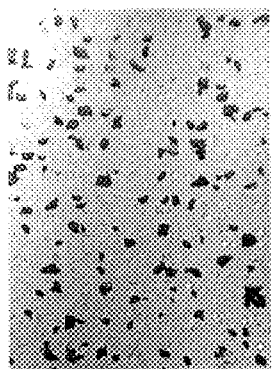
FIGS. 5a to 5d are SEM photographs of a InP patterned wafer annealed at a ramp rate of 1° C./sec, 4° C./sec, 20° C./sec and 100° C./sec correspondingly.
Figure 5B:
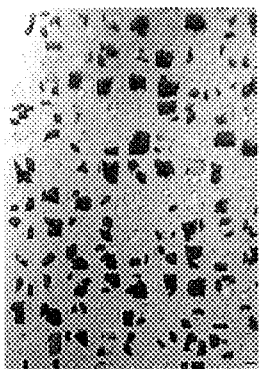
Figure 5C:
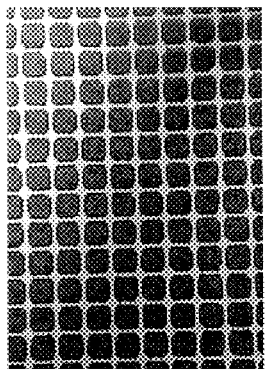
Figure 5D:
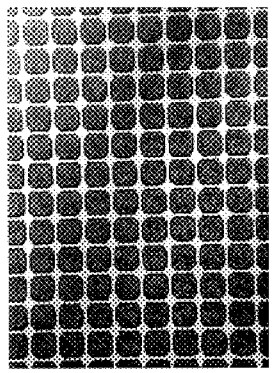

A series of experiments has been performed, including patterning of GaAs and InP substrates according the description above with light ions of hydrogen and helium having energies within a range of 800 KeV to 3 MeV and doses between $1 \times 10^{16}$ ions/cm$^2$ to $2 \times 10^{16}$ ions/cm$^2$. Masking was accomplished by three methods: patterned photo resist on GaAs, by Au patterns on the InP/InGaAsP/InP structures and by thin Ni screens of various mesh dimensions (transmission electron microscopy sample grids). The Ni grids, with openings ranging between 50 and 250 microns on edge, were held in close proximity to the sample surface during implantation to provide square patterning. Typical results of the experiments are illustrated by FIGS. 2 to 5. FIG. 2a shows a set of Nickel TEM grids 30, 32, 34 which had been used in the experiments, and FIG. 2b shows an electronic photograph of a top view of the single crystal InP patterned according to the grid. A three minute anneal at 350° C. of a sample of InP, which had been implanted with 450 KeV energy protons to a fluence of $1 \times 10^{17}$ cm$^{-2}$, resulted in the exfoliation of the material from the implanted areas. The period array of the square recesses, 150 μm on edge, reproduces the image of the TEM grid that was used as an implant mask. The newly exposed surface has formed at the end of range (Rp ~3.6 μm) of the implanted protons. The sidewall-facets of the material remaining on the wafer are shown in FIG. 3a. For this implantation the relative orientation of the TEM grid and InP lattice was arbitrary. Similar experiments have been performed for GaAs wafer and the results are illustrated in FIG. 3b where the sidewall formation is shown. Similar to designations of FIG. 1, numerals 18, 19 and 21 in FIGS. 2 and 3 correspondingly represent the top of the wafer, bottoms and sidewall-facets of the cavities made after exfoliation. As mentioned above, the method described has a low sensitivity to final annealing temperature. This result is illustrated by FIG. 4. FIGS. 4a and 4b correspond to annealing temperatures of 350° C. and 450° C. respectively, the annealing ramp rate being the same and equal to 100° C./sec. It is seen that the exfoliation occurs in a similar manner, resulting in similar sidewall formation and similar roughness of the bottom of the cavities remained on the wafer. In FIG. 5, the importance of the temperature ramp rate is demonstrated. At the lowest ramp rate studied, 1° C./s, it appears that a single blister has formed in each implanted region (FIG. 5a). Although these blisters have cracked open, most have lost a relatively small fraction of the blister decke. At 4° C./s ramp rate, exfoliation is occurring; however, it is still very variable across the sample and where it appears it is largely incomplete (FIG. 5b). An increase of the ramp rate to 20° C./s, as shown in FIG. 5c, dramatically changes the character of the exfoliation, which is now nearly total. By 100° C./s, FIG. 5d, the implanted regions are uniformly exfoliated and the unimplanted regions remain intact, without the imperfections observed at 20° C./s.

Additionally, at the higher ramp rates the exfoliated material is observed to be primarily in the form of single blocks, released intact from the implanted regions. These release characteristics suggest that rapid temperature ramp produces a more laterally uniform force on the overlayer, forcing it away from the substrate and forming the walls along the perimeter via cleavage. At lower ramp rates, the voids likely combine to form a single blister which may then crack open, releasing the trapped gas.

Figure 6:
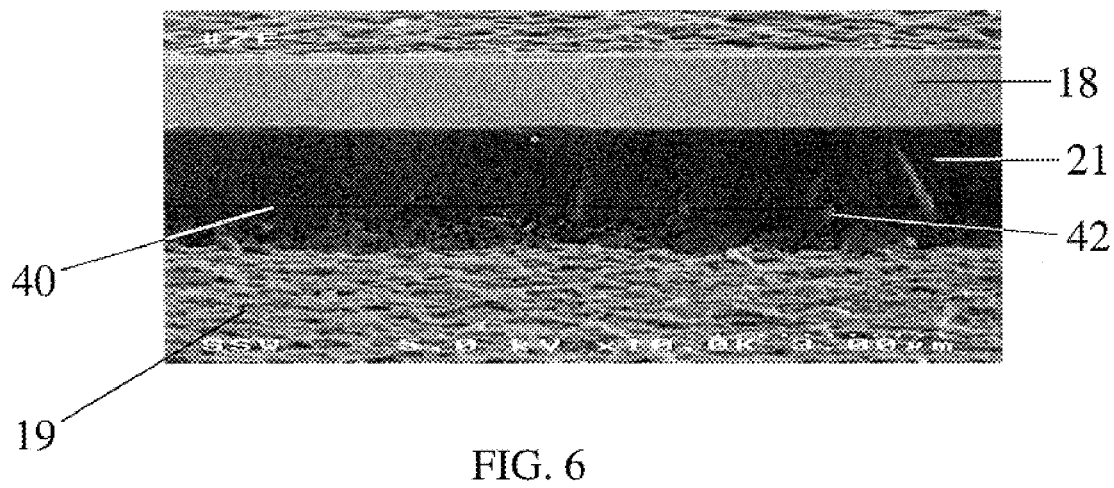
FIG. 6 is a SEM photograph of patterning of a InP wafer containing an InGaAsP buried layer.

Exfoliation in a crystal containing a buried alloy layer has also been observed (FIG. 6). InP with a InGaAsP layer 40 grown 2 μm below the surface was masked with Au stripes (not shown), each 2 μm thick, 8 μm wide and several millimeters in length. The stripes were deposited parallel to the wafer flat, i.e., along a (100) symmetry direction of the crystal. The mask was removed immediately after implantation. Examination of the areas between the stripes shows that there has been complete exfoliation, the result of which is shown in FIG. 6. The sidewall-facets 21 are observed to be relatively vertical, with imperfections near the bottom of the wall 42, at the intersection with the floor 19.

Figure 7:
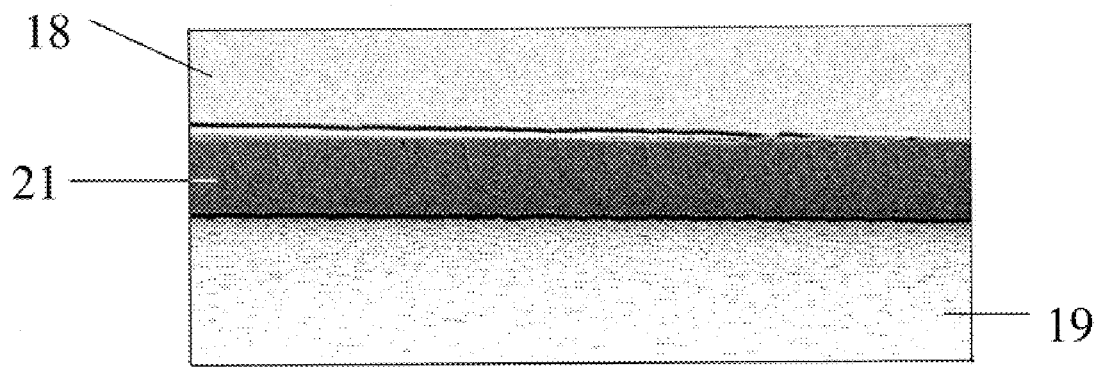
FIG. 7 illustrates patterning of an InP wafer resulting in formation of high quality sidewall-facets.

It was found that in the experiments where the mask had straight edges oriented along [100] and [010] directions on an <001> cut wafer exfoliation resulted in the formation of extremely high quality sidewall-facets of pieces of the exfoliated material and of the patterned material at natural cleavage planes of the crystal. An SEM picture shown in FIG. 7 illustrates typical results of the experiments where vertical high quality sidewall-facets 21 of the patterned structure remaining on the wafer are clearly seen. The photoresist mask has been removed from the wafer before the picture was taken.

The orientation of the sample with respect to the incident ion beam and to crystallographic directions of the wafer is an important parameter. When the ion beam is parallel to a symmetry direction of the crystal, the ions become channeled along that axis, for example along the [100] axis, and they penetrate into the wafer slightly deeper than would ions implanted along a non-symmetry direction. To avoid ion channeling, the implantation is usually performed so as to provide a slight angle between the ion beam and the normal direction to the wafer surface. In our experiments the angle was about 7° which allows us to avoid channeling and to implant ions to the calculated depth.

Instead of the method described above which includes three basic steps with the optional step of removing the mask either before or after the annealing, alternative embodiments of the method may include repetition of the steps (a) to (b) a pre-determined number of times before performing the step (c), i.e., masking and implanting may be repeated several times before the annealing. With an appropriate selection of a variety of masks, it is possible to provide the desired exfoliation of the material. The mask may be removed after each implantation, or, alternatively, all the masks may be removed together either before or after the annealing step. In another embodiment it is also contemplated that the steps (a) to (c) may be repeated as many times as needed which means that the annealing step takes place after each implantation. The mask may be removed each time either immediately before or immediately after the annealing step, or alternatively, all the masks may be removed at the end of the process. It is necessary to keep in mind that when several masks are formed on the surface of the material simultaneously, they must have specific pattern structures providing desired exfoliation of the material. Alternatively, when using the same mask, multiple implantations may be performed at different energies by repeating the step (b) the required number of times which allows deep patterning of the material, including patterning through several layers of alloys. Different types of ions may be used for different implantations, the mask being removed either before or after the annealing step. Yet in another embodiment of the invention which provides an enhanced quality of the annealing, the step (c) of annealing may be itself a multi-stage process, wherein multiple annealing is performed, each subsequent annealing being performed at a higher temperature than the previous one, with the temperature of last stage annealing being performed at the temperature required for exfoliation. In yet another embodiment of the present invention the method may further include a step of forming dashed trenches along pre-determined boundaries/perimeter of the material to be exfoliated to facilitate exfoliation of the material along the boundaries, the step being performed before the step (c) and in any sequence with the other steps. Preferably, trenches are formed by etching, or, alternatively, by the method of patterning of the present invention.

Conveniently, the depth of trenches is equal to or deeper than the depth of patterning of the material.

Numerous modifications can be made to the embodiments described above. The wafer material 10 chosen to be GaAs or InP in the first embodiment may be substituted by other materials which are brittle enough to cause selective exfoliation and to allow formation of pressurized voids during implantation. They may include non-crystalline and crystalline materials, including multi-layered semiconductor structures. The mask 12 chosen to be made of photoresist in the first embodiment may be formed of other materials, e.g. metals (aluminum, gold, nickel), dielectrics (silicon dioxide, silicon nitride) or combination thereof. The requirements for the mask materials include 1) mask to be thick enough to stop the implanted ions from reaching the substrate through the mask, 2) to be robust enough to withstand the implantation process without significant deformations, and 3) straight edges of the mask should be aligned with natural cleavage planes where the intention is to produce high quality wall/facet. The mask can be removed by chemical etching, plasma ashing or any other technique which would not destroy the patterned structure. When the plasma ashing is used, care must be taken not to heat the wafer to the temperature of annealing as this may reduce or prevent effectiveness of the exfoliation anneal. Ion implantation which is done with H and He in the first embodiment can be also done with other ions, e.g. ions of inert gases or isotopes thereof. The requirement for the type of ions is not to damage the surface of the wafer substantially and to form pressurized voids within the material which cause stress and further plastic deformation of the material.

Although specific embodiments of the invention have been described in detail, it will be apparent to one skilled in the art that variations and modifications to the embodiments may be made within the scope of the following claims.

What is claimed is:

1. A method of patterning a brittle material, comprising the steps of:
   selectively masking the material;
   implanting unmasked regions of the material with ions to a depth of patterning; and
   annealing to cause exfoliation of the material from the implanted regions.

2. The method of claim 1 wherein the brittle material comprises a non-crystalline material.

3. The method of claim 1 wherein the brittle material comprises a crystalline material.

4. The method of claim 1 wherein the brittle material comprises a semiconductor material.

5. The method of claim 4, the semiconductor material being a multi-layered semiconductor structure.

6. The method of claim 5, comprising implanting below the multi-layered structure whereby the exfoliation of the material removes several layers of the structure.

7. The method of claim 3, the mask having straight edges oriented parallel to natural cleavage planes of a crystalline material, whereby the exfoliation of the material results in formation of high quality sidewall-facets of the exfoliated material and high quality sidewall-facets of the patterned material at the boundaries of exfoliated regions.

8. The method of claim 3 wherein the annealing step comprises rapid thermal annealing.

9. The method of claim 1, wherein the annealing step comprises one of rapid thermal annealing, laser beam annealing, electron beam annealing, ion beam annealing, or a combination thereof.

10. The method of claim 1, wherein the annealing step comprises furnace annealing.

11. The method of claim 1, the ions being selected from the group consisting of ions of hydrogen, helium, neon, and isotopes thereof.

12. The method of claim 1, further comprising a step of repeating the steps of masking and implanting a number of times before performing the step of annealing, the patterns of the masks being selected so as to provide desired exfoliation of the material.

13. The method of claim 1, further comprising a step of repeating the steps of masking, implanting and annealing a number of times, the patterns of the masks being selected so as to provide a desired exfoliation of the material.

14. The method of claim 1, further comprising a step of repeating the step of implanting a number of times before performing the step of annealing.

15. The method of claim 1, the step of annealing comprising a multi-stage process, wherein multiple annealing is performed, each subsequent stage being performed at a higher temperature than the previous one, with the temperature of the last stage annealing being performed at the temperature required for exfoliation.

16. The method according to claim 1, comprising removing the masking layer after annealing.

17. The method according to claim 1, comprising removing the masking layer before annealing.

18. The method of claim 1, comprising the step of implantation comprising multiple implantations in different areas of the material to exfoliate the material from the areas to different depths.

19. The method of claim 18, wherein the multiple implantations are performed with different ions, doses and energies being performed.

20. The method of claim 1, the mask being formed of a material selected from a group consisting of a metal, dielectric, an organic material, and a combination thereof.

21. The method of claim 20, the metal being gold, aluminum or nickel.

22. The method of claim 20, the dielectric being silicon dioxide or silicon nitride.

23. The method of claim 20, the mask being formed by use of photo-lithography, etching and lift-off techniques.

24. The method of claim 16, the removing of the mask being performed by the process selected from the group consisting of plasma ashing, chemical etching, mechanical polishing, and ion etching.

25. The method of claim 17, the removing of the mask being performed by the process selected from the group consisting of plasma ashing, chemical etching, mechanical polishing, and ion etching.

26. The method of claim 4, comprising ion implanting to a depth of about several nanometers to about tens of micrometers, lateral dimensions of exfoliated pieces being from about several micrometers to about several cm.

27. The method of claim 1, the method further comprising a step of patterning trenches along the boundaries of the material to be exfoliated, thereby facilitating exfoliation of the material.

28. The method of claim 27, the depth of the trenches being equal or deeper than the depth of patterning of the material.

* * * * *